(12) United States Patent
Ito

(10) Patent No.: US 10,306,774 B2
(45) Date of Patent: May 28, 2019

(54) LAMINATE STRUCTURE OF METAL COATING

(71) Applicant: ELECTROPLATING ENGINEERS OF JAPAN LIMITED., Tokyo (JP)

(72) Inventor: Masahiro Ito, Hiratsuka (JP)

(73) Assignee: ELECTROPLATING ENGINEERS OF JAPAN LIMITED., Tokyo (JP)

( * ) Notice: Subject to any disclaimer, the term of this patent is extended or adjusted under 35 U.S.C. 154(b) by 0 days.

(21) Appl. No.: 16/099,876

(22) PCT Filed: Sep. 13, 2017

(86) PCT No.: PCT/JP2017/033131
§ 371 (c)(1),
(2) Date: Nov. 8, 2018

(87) PCT Pub. No.: WO2018/056145
PCT Pub. Date: Mar. 29, 2018

(65) Prior Publication Data
US 2019/0090357 A1    Mar. 21, 2019

(30) Foreign Application Priority Data

Sep. 23, 2016 (JP) .................. 2016-185414

(51) Int. Cl.
*H05K 1/09* (2006.01)
*H05K 3/38* (2006.01)
(Continued)

(52) U.S. Cl.
CPC ............. *H05K 3/387* (2013.01); *B32B 15/01* (2013.01); *B32B 15/08* (2013.01); *C23C 18/42* (2013.01); *C23C 28/00* (2013.01); *C25D 5/54* (2013.01); *H05K 3/185* (2013.01); *H05K 1/032* (2013.01); *H05K 1/09* (2013.01);
(Continued)

(58) Field of Classification Search
CPC .......... H05K 1/09; H05K 1/092; H05K 1/095; H05K 1/097
See application file for complete search history.

(56) References Cited

U.S. PATENT DOCUMENTS 9,932,676 B2    4/2018  Ito et al.

FOREIGN PATENT DOCUMENTS

JP    4649666 B2    3/2011
JP    2012-180561 A    9/2012
(Continued)

OTHER PUBLICATIONS

PCT/ISA/210, "International Search Report for International Application No. PCT/JP2017/033131," dated Oct. 17, 2017.
(Continued)

*Primary Examiner* — Jeremy C Norris
(74) *Attorney, Agent, or Firm* — Manabu Kanesaka

(57) ABSTRACT

A laminate structure of metal coating is laminated on a base material, and includes a primer layer, a catalyst layer and a plating deposited layer. The primer layer is a resin layer with a glass transition temperature (Tg) of 40 to 430° C. The catalyst layer is a metal nanoparticle group arranged in a plane on the primer layer, wherein the metal nanoparticle group is a metal in Group 11 or Groups 8, 9 and 10 in a periodic table, and the metal nanoparticles are surrounded by the primer layer. Ends of the metal nanoparticles are attached to the plating deposited layer.

7 Claims, 3 Drawing Sheets

1. Plating deposited layer
2. Metal nanoparticles
3. Primer layer
4. Base material

(51) Int. Cl.
    *H05K 3/18*     (2006.01)
    *B32B 15/01*     (2006.01)
    *B32B 15/08*     (2006.01)
    *C23C 18/42*     (2006.01)
    *C23C 28/00*     (2006.01)
    *C25D 5/54*     (2006.01)
    *H05K 1/03*     (2006.01)

(52) U.S. Cl.
    CPC .................. *H05K 2203/072* (2013.01); *H05K 2203/0709* (2013.01); *H05K 2203/1105* (2013.01)

(56) References Cited

FOREIGN PATENT DOCUMENTS

| | | |
|---|---|---|
| JP | 5240812 B2 | 7/2013 |
| JP | 2016-023323 A | 2/2016 |
| WO | 2016/017625 A1 | 2/2016 |
| WO | 2016/098680 A1 | 6/2016 |

OTHER PUBLICATIONS

PCT/ISA/237, "Written Opinion of the International Searching Authority for International Application No. PCT/JP2017/033131," dated Oct. 17, 2017.

LAMINATE STRUCTURE OF METAL COATING

RELATED APPLICATIONS

The present application is National Phase of International Application No. PCT/JP2017/033131 filed Sep. 13, 2017, and claims priority from Japanese Application No. 2016-185414, filed Sep. 23, 2016, the disclosure of which is hereby incorporated by reference herein in its entirety.

DETAILED DESCRIPTION OF THE INVENTION

Technical Field

The present invention relates to a laminate structure of metal coating having excellent adhesion to a base material, particularly a laminate structure having excellent adhesion to an insulating base material.

Background Art

Electroless plating has been industrially widely used as a method for directly forming on the surface of an insulating base material, a metal coating of a base metal such as nickel (Ni), copper (Cu) or cobalt (Co) or a base metal alloy, or a noble metal such as silver (Ag), gold (Au), platinum (Pt) or palladium (Pd) or a noble metal alloy until now.

As insulating base materials on which electroless plating is carried out, there are various compositions such as glass, inorganic oxides, inorganic compounds, plastics, ceramics, organic compounds, cellulose, fabric, rubber and complexes thereof.

As specific inorganic compound-based insulating base materials, there are for example inorganic oxides such as glass, alumina, ZnO and $Cu_2O$, and inorganic compounds such as diamond, SiC, GaAs and GaN.

In addition, as specific insulating resin base materials, there are for example thermoplastic resins such as polypropylene, polyethylene, polystyrene, acryl, polyethylene terephthalate, polyphenylene ether, nylon, polyamide, polycarbonate, polyacetal, polyester, polybutylene terephthalate, polyphenylene sulfide, polyetheretherketone, polyurethane, polyimide, polyamide-imide, cyclic polyolefin, polyvinyl chloride, polyvinyl acetate, liquid crystal polymer, fluorine resin, ABS resin and AS resin, or thermosetting resins such as epoxy resin, phenol resin, melamine resin, unsaturated polyester, urea resin, alkyd resin, polyurethane, thermosetting polyimide and glass fiber reinforced plastics.

Among these insulating base materials, for materials on which the deposition of electroless plating coating is difficult, generally it is common that catalytic cores are formed on the surface of an insulating base material in advance to easily deposit an electroless plating metal. That is, when carrying out electroless plating treatment, an insulating base material is immersed in a pretreatment liquid to attach an electroless plating catalyst to a necessary part of the base material, and electroless plating is then carried out. Electroplating is further carried out as needed. At this time, it is known that a compound comprising an element in Group 11 or Groups 8, 9, 10 in the periodic table is used as an electroless plating catalyst (Japanese Unexamined Patent Application Publication No. 57-43977). In addition, a metal coating formed on such base material is pattern-etched and then used as e.g. wiring for various electric appliances and electronic devices.

In the meantime, a method for producing a laminate body having a metal coating, comprising the primer layer-forming step of forming a primer layer on an insulating base material, the layer to be plated-forming step of forming a layer to be plated on this primer layer, the catalyst-providing step of providing a plating catalyst or a precursor thereof for this layer to be plated, and the plating step of forming a metal coating on the layer to be plated by a plating treatment, is also known (Japanese Unexamined Patent Application Publication No. 2012-180561 (Patent Literature 1 described below)). In addition, a method in which a primer layer is formed on the surface of a base material, an activator is applied to the surface of this primer layer and electroless plating is then carried out is also known (Japanese Patent No. 4539101).

In addition, a primer solution containing 0.1 to 15 wt % colloidal metal and finely divided particles having silanol group and/or partially modified silanol group in an organic solvent is also known (Japanese Unexamined Patent application Publication No. 2001-262074).

In addition, a method for producing a plating coating, in which a carboxyl group on the surface of electrodeposited polyimide is modified with an amino group in an amine compound having amino groups on both ends, a metal catalyst is provided for another amino group, and electroless plating is then carried out using the metal catalyst as cores to form a coating, is disclosed (Japanese Patent No. 5240812 (Patent Literature 2 described below)).

However, such primer layer is to modify the quality of the surface of an insulating base material. In addition, attaching an electroless plating catalyst is to form an excellent plating deposited layer. In any case, a colloidal metal catalyst acting as catalytic cores is just adsorbed on a primer layer. Because of this, conventional methods have had a drawback in that the surface form of a primer material used is limited, for example the unevenness of the surface of a primer layer is enlarged to show an anchor effect between the insulating base material and plating deposited layer. As described in Japanese Unexamined Patent Application Publication No. 2001-262074, a means in which a colloidal metal is dispersed in a primer solution to strengthen binding force between a primer layer and a metal catalyst has been devised.

It should be noted that some pretreatment liquids for electroless plating and catalyst liquids for electroless plating to directly form metal catalytic cores on an insulating base material are also disclosed. They are for example colloids of gold (Au) particles and palladium (Pd) particles as described in Japanese Patent No. 4649666 (Patent Literature 3 described below), noble metal particles such as platinum (Pt) particles as described in Japanese Unexamined Patent Application Publication No. 01-319683, or copper metal particles as described in Japanese Unexamined Patent Application Publication No. 61-019782.

However, even when a conventional noble metal colloid solution is directly or indirectly used for an insulating base material, adsorption power between metal catalytic cores and the insulating base material or a primer layer varies depending on a particle diameter, and thus adhesion power with a plating deposited layer has not been necessarily sufficient. In addition, most of conventional noble metal colloid solutions are easily influenced by the surface form of an insulating base material or acids and alkalis, and thus there have been cases where nanoparticles cohere in a colloid catalyst solution, and metal catalytic cores are released from the surface of a base material to electroless plating. When such phenomenon occurs, problems in that a plating coating is abnormally deposited from an electroless plating bath and an electroless plating bath can run out of control and be broken by only one-time use have been pointed out.

Thus, in order to solve the above problems, the present inventors developed a pretreatment liquid by which a noble metal colloid is stably dispersed in all pH regions and can be uniformly adsorbed on the surface of a base material and a plating coating with a uniform thickness can be formed in a wide area by electroless plating (Japanese Unexamined Patent Application Publication No. 2016-023323 (Patent Literature 4 described below)). This pretreatment liquid is to make the particle diameter of a catalyst metal uniform.

A catalyst metal deposited by this pretreatment liquid is stable in an electroless plating bath in all pH regions. However, even when this pretreatment liquid is applied to a common insulating base material to form catalytic cores, there have been cases where adhesion power between a deposited metal coating by electroless plating or electroplating after that and the base material is not sufficient.

For example, problems in that, when a wide area is plated, a site having weak adhesion in a deposited metal coating is formed and, for example when a large quantity of fine comb-shaped circuits is plated, a circuit which does not have uniform adhesion power is formed, have been developed. In addition, there have been cases where catalytic cores are irregularly grown in unspecific sites and become coarse, and there has also been a problem in that a uniform metal coating cannot be stably formed on a constant basis.

It is also thought that a primer layer is provided on a common insulating base material and catalytic cores are formed using this pretreatment liquid (Japanese Unexamined Patent Application Publication No. 2016-023323 (Patent Literature 4 described below 4)).

It is however realistically difficult to arrange a metal nanoparticle group with an equal particle diameter in a plane on a primer layer. When the stable equilibrium condition of catalytic cores is lost by changes in the surface texture of a primer layer, and changes in van der Waals' force and thermal energy (Brownian fluctuations) in a solution due to changes in the temperature of a pretreatment liquid, metal nanoparticle arrangement is disturbed and the particles can adhere to each other. In this case, a site having weak adhesion power between a primer layer and a catalyst layer comprising a colloidal metal is partly formed, and the above problems developed at such site have still remained.

CITATION LIST

Patent Literature

Patent Literature 1: Japanese Unexamined Patent Application Publication No. 2012-180561
Patent Literature 2: Japanese Patent No. 5240812
Patent Literature 3: Japanese Patent No. 4649666
Patent Literature 4: Japanese Unexamined Patent Application Publication No. 2016-023323

SUMMARY OF THE INVENTION

Technical Problem

The present invention has been made to solve a problem in that the adhesion of a deposited metal coating is weak and thus uniform adhesion power cannot be obtained, or a problem in that a uniform metal coating cannot be obtained because part of metal nanoparticles has weak adhesion power to a primer layer due to, for example, partial cohesion of metal nanoparticles. An object of the present invention is to provide a laminate structure in which metal nanoparticles in a catalyst layer are surrounded by a primer layer and one end thereof is attached to a plating deposited layer.

Solution to Problem

As a result of diligent investigation, the present inventors have found that by using a resin layer with a glass transition temperature (Tg) of 40 to 430° C. as a primer layer, a spherical metal nanoparticle group sinks in the primer layer to obtain more contact area between metal nanoparticles and the primer layer than before. The inventors also found that by making the average particle diameter of metal nanoparticles uniform, the spherical metal nanoparticle group can be arranged in a plane on the primer layer at almost regular intervals.

Furthermore, a structure in which spherical metal nanoparticles 2 are surrounded by the primer layer 3 and one end thereof is attached to the plating deposited layer 1 as schematically shown in FIG. 1 was successfully obtained by applying heat to the primer layer for fluidization. The fluidized primer layer is solidified at room temperature and thus the contact area between the metal nanoparticles and the primer layer dramatically increases and joint strength between the primer layer and the catalyst layer becomes strong.

The laminate structure of metal coating of the present invention is characterized in that in a cross-section structure in which three layers, a primer layer, a catalyst layer and a plating deposited layer, are laminated on a base material, the primer layer is a resin layer with a glass transition temperature (Tg) of 40 to 430° C. and the catalyst layer is a metal nanoparticle group arranged in a plane on the primer layer, wherein the metal nanoparticle group is a metal in Group 11 or Groups 8, 9, 10 in the periodic table, and the metal nanoparticles are surrounded by the primer layer and one end thereof is attached to the plating deposited layer.

In the present invention, in order to obtain a structure in which spherical metal nanoparticles are surrounded by a primer layer and one end thereof is exposed from the primer layer by applying heat to the primer for fluidization, the primer layer with a glass transition temperature (Tg) of 40 to 430° C. is used. It is thought that a plating deposited layer comprising a metal deposited from ions is metal-bound to metal nanoparticles in the one end thereof. It should be noted that metal nanoparticles are not diffused into the plating deposited layer in this range of temperature.

In the present invention, the glass transition temperature (Tg) is 40 to 430° C., preferably 50 to 350° C. In order to obtain a structure in which metal nanoparticles are surrounded by a primer layer and one end thereof is attached to a plating deposited layer, heat treatment should be carried out after plating at 40° C. or higher and in the range of the glass transition temperature (Tg) of the primer layer ±50° C. This is because changes in the quality of the primer layer are avoided. The temperature of heat treatment is preferably 40° C. or higher and in the range of the glass transition temperature (Tg) of a primer layer ±40° C., more preferably 40° C. or higher and in the range of the glass transition temperature (Tg) of a primer layer ±30° C. In order to carry out fluidization at a low temperature, process time is only needed to be longer.

The structure is schematically shown in FIG. 1. That is, spherical metal nanoparticles 2 shown by circle are surrounded by the primer resin layer 3, the upper layer thereof is the plating deposited layer 1, and the lower layer thereof is the insulating base material layer 4. Because the primer layer is solidified, adhesion power between the catalyst layer comprising metal nanoparticles and the primer layer is strong. In addition, because the metal nanoparticles and the plating deposited layer are metal-bound, adhesion power between the catalyst layer comprising metal nanoparticles and the plating deposited layer is also strong.

As specific resin materials as a primer layer, there are polyamide resin (glass transition temperature (Tg) about 50° C.), polyester resin (glass transition temperature (Tg) about 75° C.), polyvinyl chloride resin (glass transition temperature (Tg) about 80° C.), olefin resin (glass transition temperature (Tg) about 120° C.), epoxy resin (glass transition temperature (Tg) about 130° C.), polycarbonate resin (glass transition temperature (Tg) about 150° C.), phenol resin (glass transition temperature (Tg) about 160° C.), polysulfone resin (glass transition temperature (Tg) about 190° C.), polyimide resin (glass transition temperature (Tg) about 400° C.) and the like.

In the present invention, metals in Group 11 or Groups 8, 9, 10 in the periodic table are used as a metal nanoparticle group because these are effective metals as a colloid catalyst for electroless plating. Specific metals include gold (Au), silver (Ag), copper (Cu), platinum (Pt), palladium (Pd), rhodium (Rh), iridium (Ir), ruthenium (Ru), nickel (Ni), cobalt (Co) and iron (Fe). The above metal nanoparticles are preferably gold (Au), silver (Ag), platinum (Pt) or palladium (Pd), and more preferably gold (Au) or palladium (Pd). These metals can be dispersed in an aqueous solution or organic solvent in a stable colloid state by a polymer dispersant such as polyvinylpyrrolidone or a low molecular weight dispersant such as a sugar alcohol.

The average particle diameter of the above metal nanoparticles is preferably 1 to 100 nm, and more preferably 3 to 80 nm.

The metal nanoparticle group is preferably one having particle diameters as uniform as possible. This is because mutual repulsion in a metal nanoparticle group is made uniform to uniformly arrange the metal nanoparticle group on a primer layer. The particle diameter of metal nanoparticles has preferably a variation coefficient C.V. <0.8, and more preferably a variation coefficient C.V. <0.6.

When the particle diameter of a metal nanoparticle group is made uniform and the metal nanoparticle group is uniformly arranged on a primer layer, the metal nanoparticles are uniformly surrounded by the primer layer and a void is not generated between the primer layer and a plating deposited layer. That is, a structure in which the plating deposited coating and the primer layer metal-bound to metal nanoparticles are engaged through the metal nanoparticles is formed to obtain strong adhesion power.

As shown in FIG. 2, when the particle diameter of a metal nanoparticle group is random or a partly aggregated metal nanoparticle group exists, the metal nanoparticles 2 are not uniformly surrounded by the primer layer 3 and a void is generated between the primer layer 3 and the plating deposited layer 1, and thus sufficient adhesion force cannot be obtained.

In order to increase the surface area of metal nanoparticles contacting a primer layer, metal nanoparticles are surrounded by the primer layer and one end thereof is attached to a plating deposited layer in the present invention. When a spherical metal nanoparticle group is arranged on the primer layer and the surface thereof is further covered with the primer, the contact area increases. The spherical metal nanoparticles are individually fixed and thus the binding power between the catalyst layer and the primer layer in the whole metal nanoparticle group becomes much stronger than before.

The "being surrounded" specifically means a state in which a metal nanoparticle group sinks in a primer layer due to the fluidization of the primer layer, more particle surface area contacts the primer before fluidization and one end of a particle is exposed.

When a primer layer is heated to a temperature above the glass transition temperature (Tg) thereof, the primer layer is fluidized, a metal nanoparticle group sinks in the primer layer, and more particle surface contacts the primer. In addition, when a primer layer is heated to a temperature near the glass transition temperature (Tg) thereof and is kept at the temperature for a certain period of time, similarly, more particle surface in a metal nanoparticle group contacts the primer. As described above, the "surrounded" state, in which metal nanoparticles fixed on a primer layer are allowed to sink in the primer layer due to the fluidization of the primer layer, particle surfaces are allowed to contact the primer in more area than that before fluidization, and one end of a particle is exposed (see Example 1), can be obtained.

It should be noted that, because the joint strength of the whole metal nanoparticle group is the sum of metal nanoparticles each, when the particle diameter of metal nanoparticles each decreases if only a little, theoretically the sum of contact area increases, and adhesion power between a primer layer and a catalyst layer dramatically increases.

A preferred embodiment of the present invention is as described below. That is, the above metal nanoparticles are preferably gold (Au), silver (Ag), platinum (Pt) or palladium (Pd). In addition, the average particle diameter of the above metal nanoparticles is preferably 1 to 100 nm. In addition, the particle diameter of the metal nanoparticles has preferably a variation coefficient C.V. <0.8. In addition, the glass transition temperature (Tg) of the above primer layer is preferably 40 to 430° C., and more preferably 50 to 350° C. In addition, the above plating deposited layer is preferably an electroless plating deposited layer and an electroplating deposited layer. In addition, it is preferred that the above catalyst layer be partly arranged on the above primer layer and the above plating deposited layer thereon form a metallic circuit.

In addition, when a metallic circuit is formed on a base material in the present invention, a catalyst layer can be partly arranged on a primer layer. For example, a primer layer having an amino group on the surface thereof is formed, and the amino group is removed by partly irradiating ultraviolet rays at a wavelength of 180 to 300 nm using a photomask. After that, a catalyst layer can be formed only on a site on which the amino group remains by immersing a base material in a solution containing a metal nanocatalyst with a minus zeta potential (see Example 2). Alternatively, a catalyst layer is formed on a primer layer and then the catalyst layer can be also removed by e.g. laser ablation. Unnecessary operations such as a development step and etching step are not required. It should be noted that a primer layer can be easily applied by e.g. spin coating, bar coating or inkjet printing, dried and formed.

In the present invention, as the pretreatment liquid, a pretreatment liquid which the present inventors developed (Japanese Unexamined Patent Application Publication No. 2016-023323 (Patent Literature 4 described above)) can be also used. That is, metal nanoparticles can be dispersed in an aqueous solution of sugar alcohol. The aqueous solution of sugar alcohol is an aqueous solution of at least one or more of the group consisting of tritol, tetritol, pentitol, hexitol, heptitol, octitol, inositol, quercitol and pentaerythritol. In particular, it is preferred that these aqueous solutions be combined with any of metal nanoparticles, such as gold (Au), platinum (Pt) or palladium (Pd). In addition, the aqueous solution has preferably pH=6 to 7.5.

For example, it is particularly preferred that metal nanoparticles be palladium (Pd) and the sugar alcohol be at least one or more of glycerin, erythritol, xylitol or mannitol. In addition, it is particularly preferred that metal nanoparticles be gold (Au) and the sugar alcohol be at least one or more of glycerin, erythritol, xylitol, mannitol or pentaerythritol.

This pretreatment liquid does not have a component which is spontaneously decomposed to volatilize a gas, and thus deposited catalytic cores do not have a gas component. In addition, used waste liquid after deposition of metal nanoparticles is also stable. Therefore, when catalytic cores are formed on a primer layer, runaway reaction does not occur. It should be noted that a conductive salt and a surface-active agent to make fine adjustments to this pretreatment liquid for electroless plating can be contained. This is because, for example even when a tiny amount of surface-active agent is added, a zeta potential is little changed and aggregate balls of smaller metal nanoparticles and a metal nanoparticle group more uniformly arranged can be formed.

In addition, a metal nanoparticle group which does not contribute to adsorption can be easily washed away from a primer layer by washing with water. This is because the catalyst layer of the present invention is a first row dense metal nanoparticle group arranged at regular intervals on a plane surface and thus a second row metal nanoparticle group which does not contribute to adsorption repels the first row dense metal nanoparticle group and metal nanoparticles cannot be metal-bound to each other.

Advantageous Effect of the Invention

According to the laminate structure of metal coating of the present invention, metal nanoparticles are surrounded by a primer layer and one end thereof is attached to a plating deposited layer, and thus joint force between a catalyst layer and the primer layer in the laminate structure of metal coating can be dramatically improved. In addition, a metal nanoparticle group can be arranged and fixed in a plane on the primer layer on a base material in an insulating base material, and a plating deposited layer having a stable joint strength can be formed even when the plating deposited layer has a fine form.

Furthermore, because the glass transition temperature (Tg) of a primer layer is 40 to 430° C., when the primer layer is fluidized at a temperature near this glass transition temperature (Tg), the whole base material is heat-treated. As a result, adhesion power between the base material and the primer layer becomes better, and moreover adhesion power between the primer layer and a plating deposited layer also becomes better. That is, this adhesion power becomes better, and thus a plating deposited layer can be thickened and an effect, in which a metal coating with a low electric resistance can be formed using a simple laminate structure, is shown. A metal coating produced by the laminate structure of metal coating of the present invention shows an effect in which a metal coating with an extremely low resistance, not more than 1.5 times the resistance value as metal copper (Cu) which has not been seen before, can be obtained (see Example 3).

In addition, according to the laminate structure of metal coating of the present invention, a catalyst layer can be partly arranged on a primer layer by modifying a functional group on the surface of the primer layer by electromagnetic wave irradiation or removing the catalyst layer, and an effect, in which a complicated metallic circuit can be formed, is shown.

EXPLANATION OF NUMERALS

1: Plating Deposited Layer 2: Metal Nanoparticles 3: Primer Layer 4: Base Material

BEST MODE FOR CARRYING OUT THE INVENTION

The present invention will now be described in detail by way of examples thereof. It should be noted, however, that the present invention is not limited thereto.

Example 1

As an insulating base material A, glass (EAGLE XG manufactured by CORNING) was used. As a primer solution, a polyester resin solution (glass transition temperature (actual measurement value) 72° C.) was used. The primer solution was applied to the insulating base material A by a bar coating method and dried at 100° C. for 5 minutes to forma primer layer with a thickness of 0.12 $\mu m^2$ as a dried coating thickness.

Figure 3:
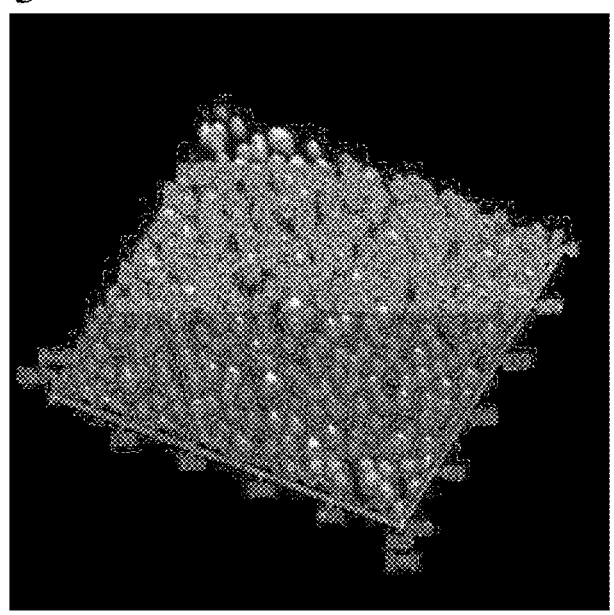
FIG. 3 is an atomic force micrograph which shows a metal nanoparticle group before fluidization according to an example of the present invention.

This insulating base material A provided with the primer layer was immersed in an aqueous solution containing colloidally dispersed spherical gold (Au) nanoparticles (0.1 g/L as Au) with an average particle diameter of 20 nm (variation coefficient C.V.=0.15) for 10 minutes and then washed with pure water. As a result, a substrate having a catalyst layer in which nanoparticles with an average particle diameter of 20 nm are adsorbed on the primer layer at an average adsorption density of 273 particles/0.25 $\mu m^2$ was obtained (FIG. 3). A scanning probe microscope (AFM5400L manufactured by Hitachi High-Tech Science Corporation) was used for the observation of surface form. In addition, the average height of this metal nanoparticle group was 14 nm. That is, assuming that the form of a metal nanoparticle group is a completely independent spherical form, theoretically 6 nm obtained by subtracting an average height of 14 nm from a particle diameter of 20 nm penetrates the primer layer.

Figure 4:
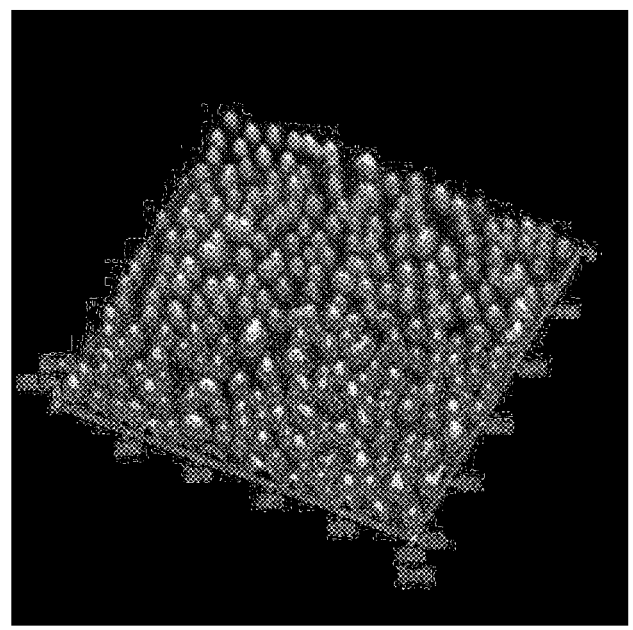
FIG. 4 is an atomic force micrograph which shows a metal nanoparticle group after fluidization according to an example of the present invention.

The state of the metal nanoparticle group on the primer layer after heating the above substrate at 50° C. for 5 minutes to fluidize the primer layer is shown in FIG. 4. As shown in FIG. 4, the average adsorbed particle density of the metal nanoparticle group on the primer layer was 249 particles/ 0.25 µm², and there was little change from before primer fluidization. In the meantime, the average height of this metal nanoparticle group was 12 nm. That is, theoretically 8 nm penetrated the primer layer and sank deeper by 2 nm than before fluidization.

Figure 5:
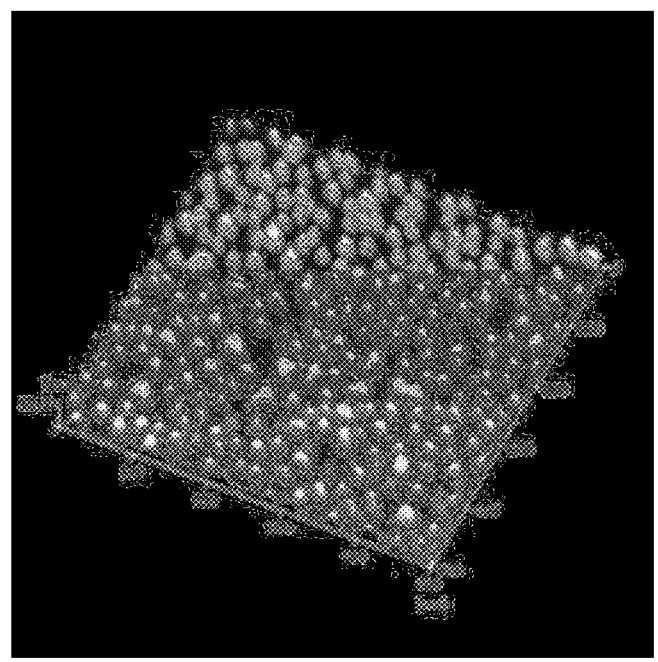
FIG. 5 is an atomic force micrograph which shows a metal nanoparticle group after fluidization according to an example of the present invention.

Furthermore, the state of the metal nanoparticle group on the primer layer after heating the above substrate at 100° C. for 5 minutes to fluidize the primer layer again is shown in FIG. 5. As shown in FIG. 5, the average adsorbed particle density of the metal nanoparticle group on the primer layer was 280 particles/0.25 µm², and there was little change from before primer fluidization. In the meantime, the average height of this metal nanoparticle group was 11 nm. That is, theoretically 9 nm penetrated the primer layer and sank deeper by 3 nm than before fluidization.

The above substrate heated at 100° C. for 5 minutes was immersed in a 65° C. electroless gold (Au) plating solution (PRECIOUSFAB ACG3000WX manufactured by Electroplating Engineers of Japan Ltd.) for 10 minutes to obtain an electroless gold (Au) plated layer with a thickness of 0.1 µm. When this plated layer was subjected to an adhesion test by a cross-cut method, peeling did not occur.

In the meantime, an electroless gold (Au) plated layer with a thickness of 0.1 µm was formed in the same manner on a substrate in which a primer layer was not fluidized after a catalyst layer was formed. When this plated layer was subjected to an adhesion test by a cross-cut method, peeling occurred in 95% of the area.

As described above, it is found that the primer layer is not decomposed even when heated at a temperature above a glass transition temperature (actual measurement value) of 72° C., and the metal nanoparticle group is allowed to sink. Therefore, it is expected that when the primer is fluidized after an electroless plating layer is provided for this substrate, a structure in which metal nanoparticles are surrounded by the primer layer and one end thereof is attached to a plating deposited layer can be obtained. In addition, even when applying heat at 100° C., gold (Au) nanoparticles are not diffused into the plating deposited layer. As a result, a structure in which the plating deposited coating and the primer layer metal-bound to metal nanoparticles are engaged through metal nanoparticles is formed to obtain strong adhesion power.

Example 2

As an insulating base material B, a polyester film (Lumirror S10 manufactured by Toray Industries, Inc.) was used. As a primer solution, an amino group-containing polyester resin solution (glass transition temperature 80° C.) was used. The primer solution was applied to the insulating base material B by a bar coating method and dried at 100° C. for 5 minutes to form a primer layer with a thickness of 0.07 µm as a dried coating thickness.

Next, this base material was irradiated with a wavelength of 300 nm or less for 30 seconds from a distance of 10 mm by a UV light source device (Model 312 manufactured by TECHNOVISION, Inc.) A quartz mask having a light shielding pattern formed with chromium was put between the light source and the base material. As a result, an amino group on the primer at a site to which ultraviolet rays were applied disappeared.

The insulating base material B thus treated was immersed in an aqueous solution (zeta potential −56 mV) containing colloidally dispersed spherical gold (Au) nanoparticles (0.1 g/L as Au) with an average particle diameter of 20 nm (variation coefficient C.V.=0.15) and 0.3 g/L xylitol for 10 minutes. As a result, gold (Au) nanoparticles were adsorbed only on a part in which the amino group remained on the primer layer to partly form a catalyst layer on the primer layer.

Figure 6:
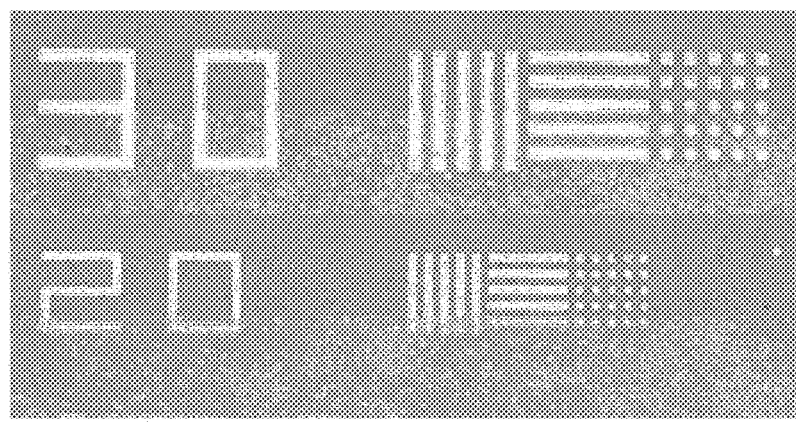
FIG. 6 is a micrograph which shows a metallic circuit according to an example of the present invention.

Next, the substrate having this partly formed catalyst layer was immersed in a 65° C. electroless gold (Au) plating solution (PRECIOUSFAB ACG3000WX manufactured by Electroplating Engineers of Japan Ltd.) for 10 minutes to obtain an electroless gold (Au) plated layer with a thickness of 0.1 µm. At this point of time, a circuit pattern with line width/line space=30/30 and 20/20 µm was formed along a site on which the catalyst layer was arranged as described in FIG. 6.

Figure 1:
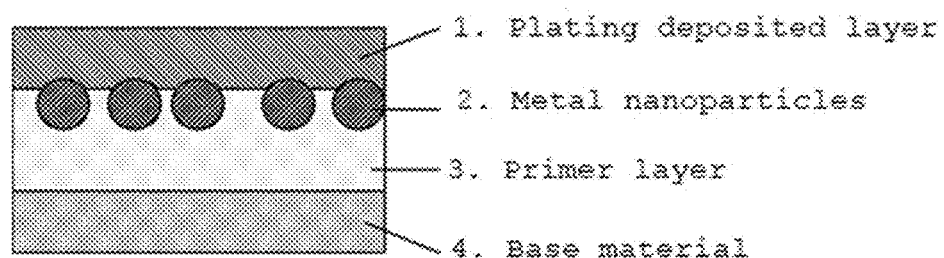
FIG. 1 is a cross-sectional view which shows a joint structure after fluidization according to an embodiment of the present invention.
Figure 2:
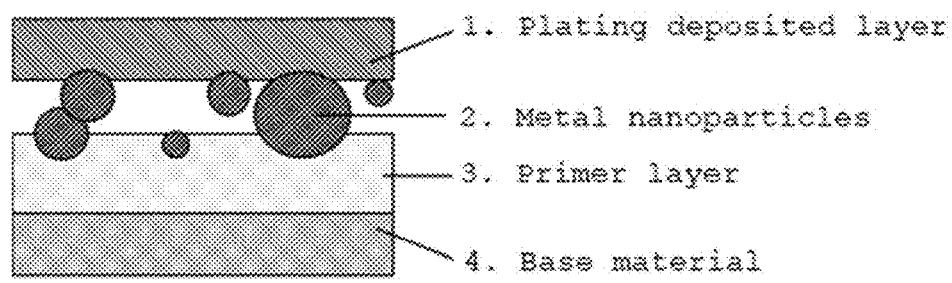
FIG. 2 is a cross-sectional view which shows a joint structure before fluidization according to an embodiment of the present invention.

Furthermore, the above substrate was heated at 100° C. for 5 minutes to fluidize the primer layer, and a structure in which metal nanoparticles are surrounded by the primer layer and one end thereof is attached to a plating deposited layer was obtained. When a circuit formed on this substrate was subjected to an adhesion test by a cross-cut method, peeling did not occur. As can be seen from FIG. 1, this is because a structure in which metal nanoparticles are surrounded by the primer layer and one end thereof is attached to the plating deposited layer can be obtained by fluidization treatment.

Example 3

As an insulating base material C, a polyimide film (UPILEX 50SGA manufactured by Ube Industries, Ltd.) was used. As a primer solution, an olefin resin solution (glass transition temperature 130° C.) was used. The primer solution was applied to the insulating base material C by a spin coating method and dried at 150° C. for 15 minutes to form a primer layer with a thickness of 0.3 µm as a dried coating thickness.

This insulating base material C provided with the primer layer was immersed in an aqueous solution containing colloidally dispersed spherical palladium (Pd) nanoparticles (0.3 g/L as Pd) with an average particle diameter of 3 nm (variation coefficient C.V.=0.40) and 0.01 g/L polyethylene imine (average molecular weight 10000) for 10 minutes to obtain a substrate provided with a catalyst layer having palladium (Pd) nanoparticles adsorbed on the primer layer.

Next, this substrate was immersed in a 52° C. electroless palladium (Pd) plating solution (LECTROLESS Pd200S manufactured by Electroplating Engineers of Japan Ltd.) for 5 minutes to obtain an electroless palladium (Pd) plated layer with a thickness of 0.05 µm.

After that, the above substrate was heated at 150° C. for 5 minutes to fluidize the primer layer. When the formed coating was subjected to an adhesion test by a cross-cut method, peeling did not occur.

Furthermore, electrolytic plating was carried out on the above substrate using a 25° C. electrolyte copper (Cu) plating solution (MICROFAB Cu500 manufactured by Electroplating Engineers of Japan Ltd.) to obtain an electrolyte copper (Cu) plated layer with a thickness of 1.0 µm. Even when the substrate was wound at a thickness with a curvature radius of 3 mm, peeling of the plated layer did not occur. In addition, when the volume resistance ρ of the plated layer was measured using a resistivity meter (Loresta-GX manufactured by Mitsubishi Chemical Analytech Co., Ltd.) by a four probe method, ρ was 2.2 μΩ·cm, which was a very low resistance value, not more than 1.5 times the theoretical minimum resistance value as metal copper (Cu).

Example 4

As an insulating base material D, a PTFE plate material (1 cm×4 cm, t=2 mm) was used. As a primer solution, a polyester resin solution (glass transition temperature 72° C.) was used. The primer solution was applied to the insulating base material D by immersion in the solution and dried at 100° C. for 15 minutes to form a primer layer with a thickness of 0.9 μm as a dried coating thickness.

This insulating base material D provided with the primer layer was immersed in a hexanol solution containing colloidally dispersed spherical silver (Ag) nanoparticles (8.0 g/L as Ag) with an average particle diameter of 90 nm (variation coefficient C.V.=0.04) and 0.05 g/L polyvinylpyrrolidone (K value 90) to obtain a substrate provided with a catalyst layer having silver (Ag) nanoparticles adsorbed on the primer layer.

Next, this substrate was immersed in a 65° C. electroless gold (Au) plating solution (PRECIOUSFAB ACG3000WX manufactured by Electroplating Engineers of Japan Ltd.) for 10 minutes to obtain an electroless gold (Au) plated layer with a thickness of 0.1 μm.

After that, the above substrate was heated at 100° C. for 10 minutes to fluidize the primer layer, and moreover electrolytic plating was then carried out on the above substrate using a 50° C. electrolyte silver (Ag) plating solution (PRECIOUSFAB Ag4730 manufactured by Electroplating Engineers of Japan Ltd.) to obtain an electrolyte silver (Ag) plated layer with a thickness of 20.0 μm. When the formed coating was subjected to an adhesion test by a cross-cut method, peeling did not occur.

Example 5

As an insulating base material E, a Si wafer having $SiO_2$ with a thickness of 500 nm formed on the surface by thermal oxidation method was used. As a primer solution, a polyamide-imide resin solution (glass transition temperature 370° C.) was used. The primer solution was applied on the insulating base material E by a spin coating method and dried at 250° C. for 10 hours to form a primer layer with a thickness of 6.0 μm as a dried coating thickness.

This insulating base material E was immersed in an aqueous solution containing colloidally dispersed spherical platinum (Pt) nanoparticles (0.04 g/L as Pt) with an average particle diameter of 40 nm (variation coefficient C.V.=0.65) and 0.5 g/L mannitol to obtain a substrate provided with a catalyst layer having platinum (Pt) nanoparticles adsorbed on the primer layer.

Next, this substrate was immersed in a 60° C. electroless platinum (Pt) plating solution (LECTROLESS Pt100 manufactured by Electroplating Engineers of Japan Ltd.) for 4 minutes to obtain an electroless platinum (Pt) plated layer with a thickness of 0.1 μm.

After that, the above substrate was heated at 350° C. for 30 minutes to fluidize the primer layer. When a coating formed on this substrate was subjected to an adhesion test by a cross-cut method, peeling did not occur.

Example 6

As an insulating base material F, a sapphire ($Al_2O_3$) wafer was used. As a primer, a molten polyamide resin (glass transition temperature 50° C.) was used. The primer was applied to the insulating base material F by a spin coating method to form a primer layer with a cured thickness of 5.0 μm.

This insulating base material F was immersed in an aqueous solution containing colloidally dispersed spherical gold (Au) nanoparticles (1.0 g/L as Au) with an average particle diameter of 20 nm (variation coefficient C.V.=0.45) and 0.8 g/L mannitol to obtain a substrate provided with a catalyst layer having gold (Au) nanoparticles absorbed on the primer layer.

Next, this substrate was immersed in a 25° C. electroless gold (Au) plating solution containing 10 mM sodium tetrachloroaurate(III) tetrahydrate and 20 mM hydrogen peroxide water for 4 minutes to obtain an electroless gold (Au) plated layer with a thickness of 0.1 μm.

After that, the above substrate was heated at 60° C. for 10 minutes to fluidize the primer layer. When a coating formed on this substrate was subjected to an adhesion test by a cross-cut method, peeling did not occur.

Comparative Example 1

An electroless gold (Au) plated circuit with a thickness of 0.1 μm was obtained in the same manner as in Example 2 except that the primer layer was not heated for fluidization. It is supposed that metal nanoparticles are not surrounded by the primer layer because the primer is not fluidized. When a circuit formed on this substrate was subjected to an adhesion test by a cross-cut method, peeling of electrodes occurred in 80% of the area. From comparison with Example 2, it is found that, when a primer layer is fluidized, a structure in which metal nanoparticles are surrounded by the primer layer and one end thereof is attached to a plating deposited layer is formed and thus strong adhesion is developed.

Comparative Example 2

An electroless gold (Au) plated circuit with a thickness of 0.1 μm was attempted to be obtained in the same manner as in Example 2 except that heating for fluidization of the primer layer was changed to 200° C. for 20 minutes. However, bubbles were generated between an insulating base material and a plating deposited layer during heating for fluidization of the primer layer, and the plating deposited layer was peeled. From comparison with Example 2, it is found that the primer is decomposed by heating at a temperature much higher than the glass transition temperature of the primer.

Comparative Example 3

In addition to a palladium (Pd) particle group with an average particle diameter of 3 nm, a palladium (Pd) particle group with an average particle diameter of 60 nm and a palladium (Pd) particle group with an average particle diameter of 160 nm were added to the palladium (Pd) nanoparticle-containing aqueous solution in Example 3. The average particle diameter of this whole palladium (Pd) nanoparticle-containing aqueous solution was 85 nm and the variation coefficient C.V. was 1.5. An electroless palladium (Pd) plated layer with a thickness of 0.05 μm was obtained in the same manner as in Example 3 except that this palladium (Pd) nanoparticle-containing aqueous solution was used. However, the deposition of electroless plated coating was not uniform and there was a site on which the plated coating was not partly formed. When an adhesion test by a cross-cut method was carried out after the same primer fluidization as in Example 3, peeling occurred in 40% of the area. From comparison with Example 3, it is found that, when the particle diameter of a metal nanoparticle group is made uniform and the metal nanoparticle group is uniformly arranged on a primer layer, metal nanoparticles are uniformly surrounded by the primer layer to obtain strong adhesion power.

INDUSTRIAL APPLICABILITY

A metal coating produced by the forming method of the present invention can be applied to, for example, an anti-electromagnetic wave coating and an electrical conductive body. In addition, a metal coating in a pattern form obtained by the method for forming a metal coating of the present invention can be applied to a variety of uses such as semiconductor chips, semiconductor packages, various electrical wiring boards, FPC, COF, TAB, antennas, multi-layer wiring base materials, mother boards and various electrodes.

What is claimed is:

1. A laminate structure of metal coating to be laminated on a base material, comprising:
   a primer layer, which is a resin layer with a glass transition temperature (Tg) of 40 to 430° C.,
   a catalyst layer, which is a metal nanoparticle group arranged in a plane on the primer layer, wherein the metal nanoparticle group is a metal in Group 11 or Groups 8, 9 and 10 in a periodic table, and metal nanoparticles at one side of the nanoparticle group are surrounded by the primer layer, and
   a plating deposited layer, the metal nanoparticles at another side of the nanoparticle group being attached to the plating deposited layer.

2. The laminate structure of metal coating according to claim 1, wherein the metal nanoparticles are gold (Au), silver (Ag), platinum (Pt) or palladium (Pd).

3. The laminate structure of metal coating according to claim 1, wherein an average particle diameter of the metal nanoparticles is 1 to 100 nm.

4. The laminate structure of metal coating according to claim 3, wherein a particle diameter of the metal nanoparticles has a variation coefficient C.V.<0.8.

5. The laminate structure of metal coating according to claim 1, wherein the glass transition temperature (Tg) of the primer layer is 50 to 350° C.

6. The laminate structure of metal coating according to claim 1, wherein the plating deposited layer is an electroless plating deposited layer and an electroplating deposited layer.

7. The laminate structure of metal coating according to claim 1, wherein the catalyst layer is partly arranged on the primer layer, and the plating deposited layer thereon forms a metallic circuit.

* * * * *